United States Patent
Mulkens et al.

(10) Patent No.: US 6,538,716 B2
(45) Date of Patent: Mar. 25, 2003

(54) LITHOGRAPHIC APPARATUS, DEVICE MANUFACTURING METHOD, AND DEVICE MANUFACTURED THEREBY

(75) Inventors: Johannes Catharinus Hubertus Mulkens, Maastricht (NL); Paul van der Veen, Eindhoven (NL); Willem van Schaik, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/866,875

(22) Filed: May 30, 2001

(65) Prior Publication Data

US 2002/0018189 A1 Feb. 14, 2002

(30) Foreign Application Priority Data

| Jun. 1, 2000 | (EP) | 00304673 |
| Jun. 6, 2000 | (EP) | 00304760 |

(51) Int. Cl.⁷ .......... G03B 27/52; G03B 27/42; G03B 27/32; A61N 5/00; G03L 5/00
(52) U.S. Cl. .......... 355/30; 355/53; 355/67; 355/77; 250/492.2; 250/492.22; 430/311; 430/312
(58) Field of Search .......... 355/30, 53, 67, 355/77; 250/492.2, 492.22; 430/311, 312

(56) References Cited

U.S. PATENT DOCUMENTS

| 4,825,453 A | * | 4/1989 | Kembo et al. |
| 5,559,584 A | * | 9/1996 | Miyaji et al. |
| 5,812,242 A | * | 9/1998 | Tokuda |

* cited by examiner

Primary Examiner—Russell Adams
Assistant Examiner—Khaled Brown
(74) Attorney, Agent, or Firm—Pillsbury Winthrop LLP

(57) ABSTRACT

In a lithographic projection system using exposure radiation of 157 nm, compositions of gas, e.g. levels of oxygen and water vapor, are measured in regions traversed by the projection beam. The attenuation caused by said gases is predicted and the dose of radiation accumulated during an exposure, the uniformity and angular distribution of radiation energy delivered by said projection beam to a substrate during an exposure is controlled accordingly. The control may comprise a controlled supply of $O_2$ to a volume traversed by the projection beam so as to effect a controlled attenuation of the projection beam. The $O_2$ distribution may be non-uniform, e.g. to selectively filter spatially separated diffraction orders or to eliminate non-uniformity's in the projection beam.

23 Claims, 4 Drawing Sheets

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates generally to a lithographic projection apparatus and more specifically to a lithographic projection apparatus including radiation level control.

2. Brief Description of the Related Art

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithographic projection apparatus it is important to ensure that the transmissivity of the radiation system and the projection system for radiation of the projection beam is substantially stable during an exposure of a target portion. This facilitates appropriate control over dose ("dose control"). Dose is defined as the total energy per unit area delivered to the substrate during an exposure of a target portion. Preferably the transmissivity shall be substantially stable during a plurality of exposures of adjacent target portions such as to avoid a necessity of intermediate dose calibrations. It is known that instability of transmissivity can occur due to, for example, an interaction between projection beam radiation and materials of optical elements of said radiation and projection system. Known transient variations in the transmissivity of said optical elements can be corrected for via a feed-forward control; see, for instance, U.S. Pat No. 9/461275, incorporated herein by reference.

For shorter wavelength radiation, especially for wavelength of 170 nm and below, absorption by air (through the presence of oxygen) becomes significant. Therefore, the optical path of the lithographic apparatus is evacuated or flushed ("purged") with a gas (a "purge gas") transparent to the radiation used, commonly dry $N_2$. In spite of the above known precautions, there is the problem of significant transmissivity variations due to, for instance, the presence of residual oxygen in said optical path, and leading to undesirable production errors.

SUMMARY OF THE INVENTION

One aspect of the present invention provides improved control over gas composition of gas traversed by the projection beam, so as to improve control over transmissivity variations of the radiation system and the projection system. In particular, it the invention may provide improved control over dose delivered to the substrate during an exposure of a target portion in a lithographic projection apparatus, particularly when radiation of wavelength less than about 170 nm is used.

This and other aspects are achieved according to the invention in a lithographic apparatus as specified in the opening paragraph, including a sensor to measure a gas composition in at least one region traversed by the projection beam; and a control responsive to said gas composition measured by said sensor to control the radiation energy delivered by said projection beam to said substrate during an exposure of a target portion.

Apparatus in accordance with the present invention may measure a gas composition in one or more regions through which the projection beam passes. The measurement results can serve as input for control means. The control can be arranged, for example, to calculate a prediction of absorption of radiation that will occur during an exposure of a target portion. With said prediction of absorption an appropriate correction to the dose can be calculated and adjustments to effectuate said correction can be applied. Said adjustments may comprise, for instance, an adjustment of the radiation power emitted by a radiation source supplying radiation to said radiation system, or, when said radiation source is an excimer laser, an adjustment of the number of pulses of radiation emitted by the radiation source during an exposure of a target portion. Input for the control means can also be, for example, measurement results representative of gas composition in a disk-shaped volume substantially comprising a pupil plane of the projection system (or a plane conjugate to said pupil plane in either the radiation system or the projection system). The control means can, in this example, be arranged to predict and adjust the angular distribution of radiation energy delivered to the substrate during an exposure of a target portion. The detection of gas composition preferably comprises measurement of the levels of gases known to absorb radiation of the wavelength of the projection beam, e.g. oxygen and water.

Conventionally, the dose delivered in an exposure is controlled by varying said radiation power or the duration of the exposure, or both. An energy sensor is provided at a convenient position in the radiation system, to measure the output of a radiation source supplying radiation to said radiation system. Said output as measured provides the basis for a feedback control and adjustment of, for instance, the radiation power emitted by the source or the exposure duration. Where an energy sensor is used to measure the output of the radiation source, the sensor means of the present invention may be arranged to measure gas composition in a region or regions downstream of the energy sensor. In this manner, the present invention can take account of absorption downstream of the energy sensor that would otherwise cause dose errors.

An adjustment determined according to the invention to be necessary to compensate for absorption by gas in the regions traversed by the projection beam can be combined with adjustments determined to be necessary to compensate for other factors, e.g. variations in the radiation source output or absorption by optical elements in the projection and/or radiation systems.

According to a further aspect of the invention, improved control over gas composition in a volume traversed by the projection beam is obtained by measuring said gas composition and by supplying an absorbent gas at a controlled concentration to said volume. Said absorbent gas serves to absorb radiation of the wavelength of said projection beam. A radiation absorbing system comprising a gas supply for supplying said absorbent gas may function as a partially transmissive optical filter, where the transmissivity can be varied by adjusting the gas composition.

The radiation absorbing system in a simple form comprises an enclosure having end faces substantially transparent to the radiation of the projection beam, e.g. made of $CaF_2$, together with a supply of the absorbent gas connected to the enclosure via a control valve. A further valve controls the exit of gas from the region enclosed by the enclosure, which may be effected using a vacuum pump. For simplicity, an enclosure with end faces, as described above, may hereinafter be referred to as a "chamber". The pressure and/or density of the gas in the chamber is controlled so as to provide the desired attenuation of the projection beam. The gas inlets and outlets are arranged so that the gas concentration/density in the chamber is uniform so that the beam is uniformly attenuated.

In more complex forms, the radiation absorbing system is arranged to provide a non-uniform concentration of absorbent gas so as to have a desired beam-shaping effect. This can be achieved with an array of individually controllable gas (micro-)jets allowing local control of the absorbent gas concentration or an arrangement of inlets and outlets configured to create an absorbent gas concentration gradient.

The positioning of the radiation absorbing system depends on the use to which it is put. If used for overall control of the dose (as defined above) it can be sited in, for example, the radiation system or, in case a laser is used as radiation source, in the laser beam provided to the radiation system. In the latter case it can be placed, for instance, relatively close to the radiation source. For filtering of diffraction orders of radiation diffracted upon traversing the mask, the radiation absorbing means can for instance be located such as to enclose a pupil plane of the projection system. For shaping the angular distribution of radiation energy of the projection beam the radiation absorbing means can be located such as to enclose a plane conjugate to said pupil plane, for instance in the radiation system. For control of intensity variations across the scanning slit, the radiation absorbing system can, for instance, be placed near the substrate or near the mask, or it can be placed such as to comprise a plane conjugate to the mask.

The volume to which the radiation absorbent gas is supplied may be free of other gases or may include other gases transparent to the radiation of the projection beam. For a projection beam with a wavelength of, for example, 157 nm, $O_2$ may be used as the radiation absorbing gas whilst $N_2$ may also be present as a non-absorbing purge gas.

Where a flow of radiation absorbing gas through the radiation absorbing means is provided, this can be used to carry away the heat generated on absorption of the radiation of the projection beam. Also, since the radiation beam traversing the absorbing gas may induce a chemical effect in said absorbing gas (and therefore induce a change of absorbance) the flow can be used to carry away the affected absorbing gas.

According to a further aspect of the invention there is provided a device manufacturing method comprising:
- providing a substrate that is at least partially covered by a layer of radiation-sensitive material;
- providing a projection beam of radiation using a radiation system;
- using patterning means to endow the projection beam with a pattern in its cross-section;
- projecting the patterned beam of radiation onto a target portion of the layer of radiation-sensitive material, characterized by at least one of:
  - measuring the composition of gases in at least one region traversed by said projection beam;
  - controlling the intensity of said projection beam and/or the duration of an exposure in response to said measured gas composition so that a desired dose is delivered to said substrate during an exposure, and
  - supplying an absorbent gas at a controlled concentration to a volume traversed by said projection beam to effect a desired attenuation of said projection beam, said absorbent gas absorbing radiation of the wavelength of the projection beam.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which.

In the drawings, like references indicate like parts.

DETAILED DESCRIPTION OF THE INVENTION

Embodiment 1

Figure 1:
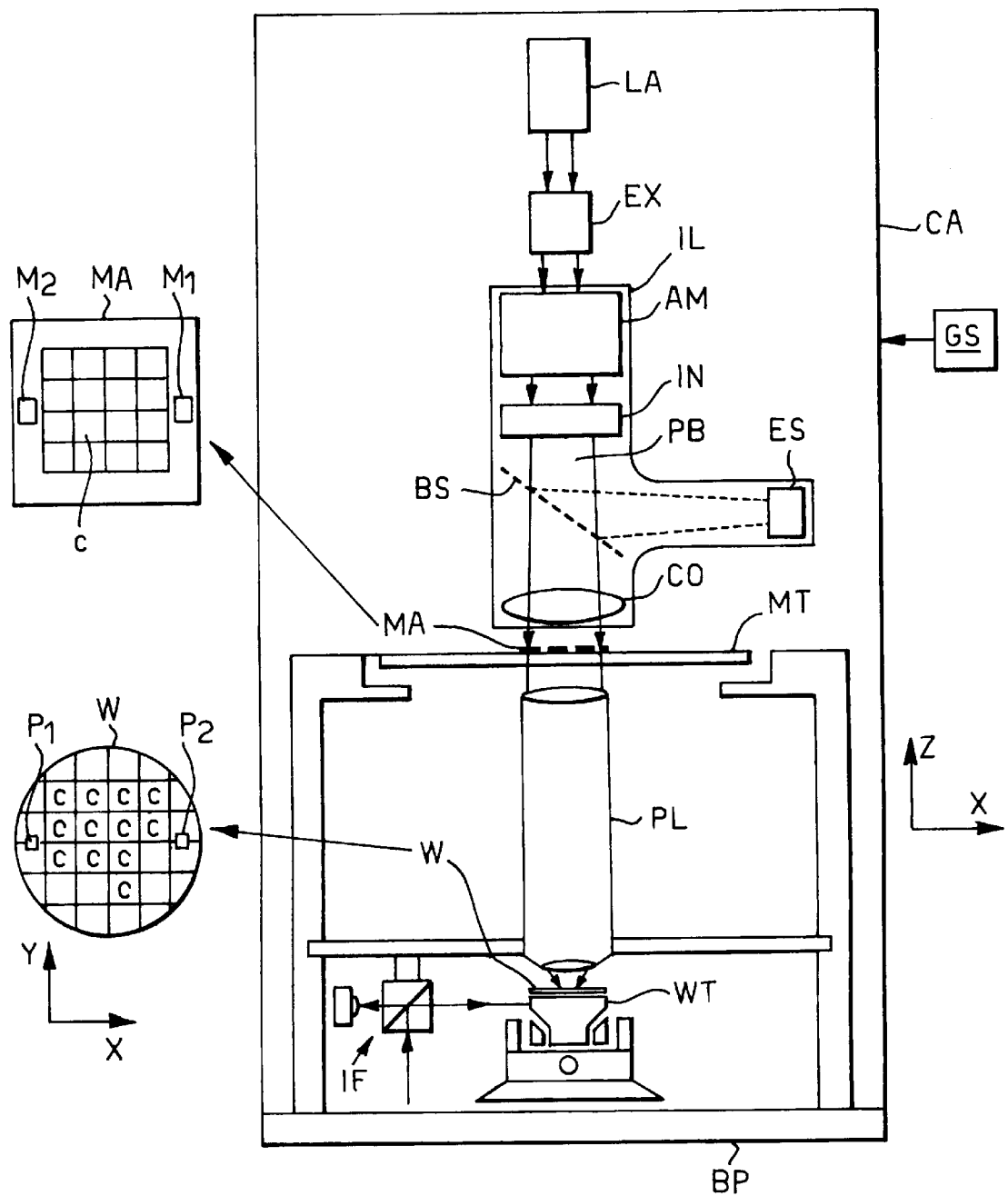
FIG. 1 depicts a lithographic projection apparatus according to an embodiment of the invention.

FIG. 1 schematically depicts a lithographic projection apparatus according to a particular embodiment of the invention. The apparatus comprises:
- a radiation system Ex, IL, for supplying a projection beam PB of radiation (e.g. UV radiation). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive or catadioptric system, or a mirror group) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means, such as a programmable mirror array of a type as referred to above.

The source LA (e.g. a Hg lamp, excimer laser, a laser or discharge plasma source or an undulator provided around the path of an electron beam in a storage ring or synchrotron which produces a beam of radiation ) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. The settings of σ-outer and σ-inner (the "sigma settings") affect the angular distribution of the radiation energy delivered by said projection beam at, for instance, the substrate. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In the illumination system IL, a part of the projection beam PB is diverted to an energy sensor ES by a beam splitter BS. Beam splitter BS may be a reflector formed by depositing aluminum on quartz and used to fold the projection beam to a convenient orientation. A pattern of small holes is etched into the aluminum layer to let a known proportion, e.g. 1%, through to the energy sensor. The output of the energy sensor is used in controlling the dose delivered in an exposure, as described further below.

Particularly in the case where radiation of wavelength 157 nm or below is used, the entire optical path of the apparatus is enclosed in one or more casings CA which can be flushed with a gas, e.g. dry $N_2$, transparent to the radiation used for the projection beam. The flushing, or purge, gas is supplied from gas supply GS which may be a container of clean gas or a plant for scrubbing and drying air.

Figure 2:
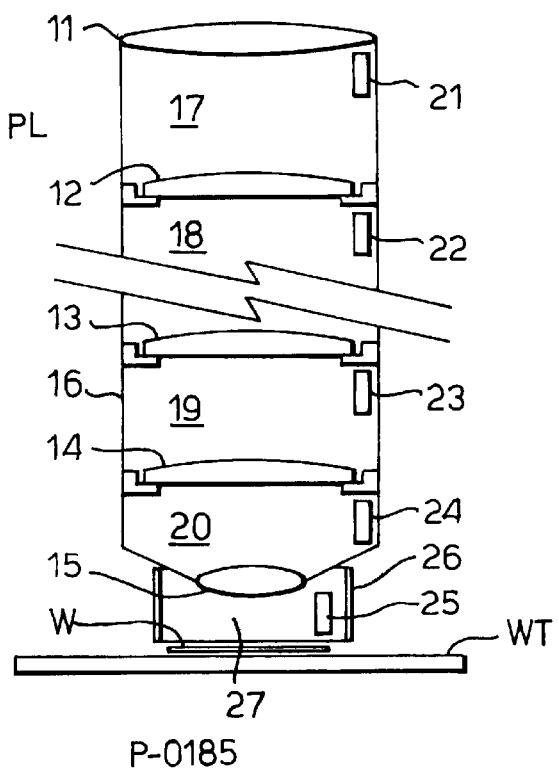
FIG. 2 is a cross-sectional view of the projection system, a substrate and the substrate table in the first embodiment of the invention.

FIG. 2 shows in cross-section the projection system PL, which comprises a plurality of optical elements 11–15 mounted in a casing 16, and an enclosure 26 between the casing 16 and the substrate table WT. For clarity only five optical elements (lenses) are shown but a projection system PL may in practice include 30 or more elements of a variety of types. The optical elements 11–15 divide the projection optical system into a plurality of chambers 17–20 in each of which is located a gas sensor 21–24. Within the chamber 27 embodied by the enclosure 26 a gas sensor 25 is located.

Gas sensors 21–25 measure the composition of gas contained in the projection lens system and the chamber 27. In particular, the sensors measure the levels of gases known to absorb radiation of the wavelength of the projection beam, e.g. $O_2$, $O_3$, $H_2O$, and/or hydrocarbons. Additional gas sensors may for instance be placed in other regions downstream of the beam splitter BS, e.g in a chamber facing the mask or in chambers within the final stages of the illumination system IL. The gas sensors preferably detect the concentration of the gases of interest by measuring absorption of radiation. The gas sensor may comprise a radiation source and radiation sensor spaced apart a known distance across the volume where the absorbent gas concentration is to be measured. The radiation source need not emit radiation of the same wavelength as the projection beam; a correction can be made to the measured absorption of radiation to amount for any difference in transmissivity of the absorbent gases to the radiation used in the sensor and the radiation of the projection beam. Alternatively, the gas sensor may comprise a radiation detector arranged to detect absorption of radiation diverted out of the projection beam. In some embodiments, chemical sensors may be used but may have too slow a response time for some applications.

Figure 3:
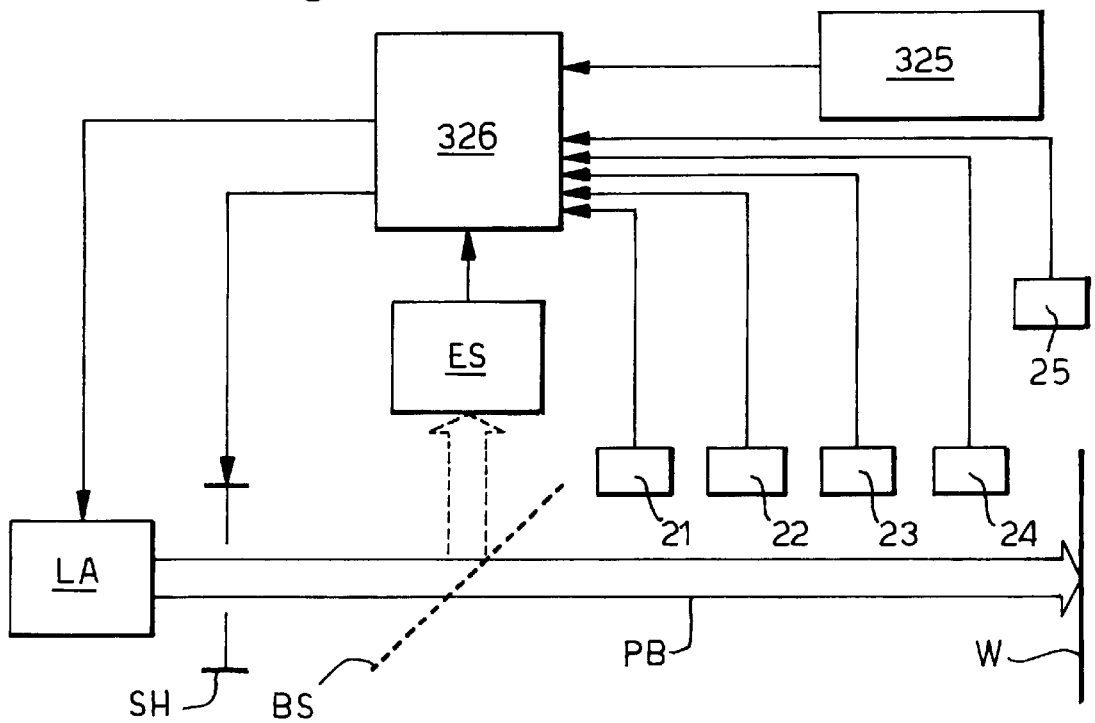
FIG. 3 is a diagram of a control system in the first embodiment of the invention.

FIG. 3 is a diagram of a control system making use of the outputs of the gas sensors 21–25 and the energy sensor ES to control exposures to ensure correct dosage. As shown in FIG. 3 and described above, a portion of the projection beam PB is diverted to energy sensor ES by beam splitter BS. Energy sensor ES measures the intensity of the radiation reaching it and gives a corresponding output. This output measures any variation in the power of radiation supplied by the radiation source LA and any variations in transmissivity along the optical path upstream of beam splitter BS. Gas sensors 21–25 are arrayed to measure gas compositions in regions of the optical path downstream of the beam splitter and provide respective outputs.

The outputs of the energy sensor ES and gas sensors 21–25 are supplied to a control circuit 326. Control circuit 326 derives from the outputs of the gas sensors 21–25 a prediction of the amount of attenuation of the projection beam PB that will occur downstream of the beam splitter BS and combines this prediction with the intensity of the projection beam as measured by the energy sensor ES to make an approximate determination of the actual intensity of the projection beam at the substrate. The degree of attenuation can be substantially determined from the measured gas compositions by knowledge of, for instance, the path length traversed by the beam in each region and the (partial) pressure and density dependence of the transmissivity of the gas components that are measured. Alternatively, it is possible to use empirical values derived using an energy sensor at substrate level to measure attenuation at different concentrations of absorbent gases.

As well as the outputs of energy sensor ES and gas sensors 21–25, the control circuit may take into account other corrections, e.g. provided by a prediction circuit 325 which predicts transient attenuation effects in optical elements downstream of the beam splitter.

Having made the approximate determination of the actual intensity of the projection beam at the substrate, the control circuit effects control of the lithographic projection apparatus to ensure that the correct dose is delivered to the substrate during successive exposures of target portions C. This control may take the form of controlling the power of radiation supplied by the radiation source LA, controlling a variable attenuator or shutter SH in the illumination system, controlling the duration of each exposure or any combination of these methods. The exposure parameters may be set in advance of each exposure or series of exposures or controlled continuously during exposures to take account of transient effects. The sampling rates of the various sensors are determined accordingly.

Embodiment 2

Figure 4:
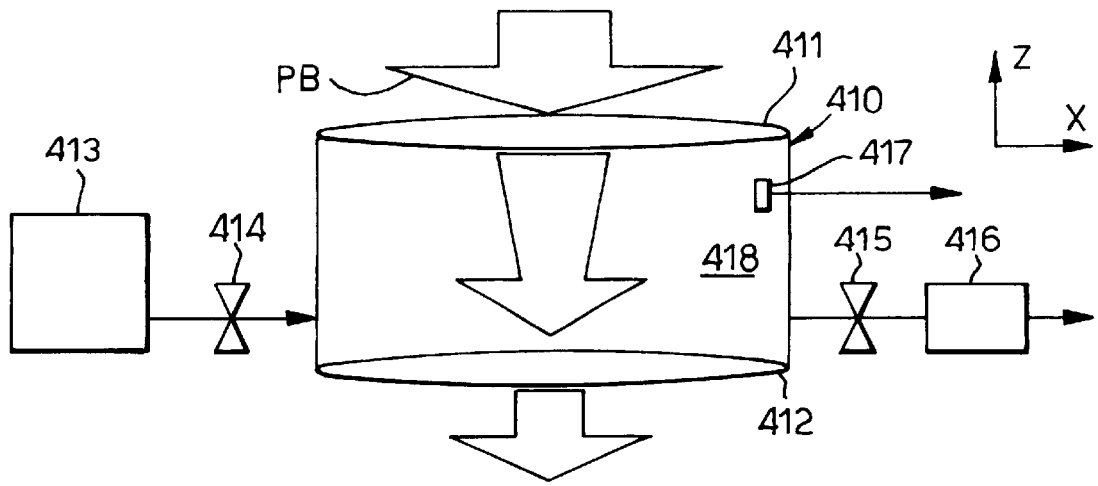
FIG. 4 is a cross-sectional view of a controllable radiation absorber used in the second embodiment of the invention.

FIG. 4 shows in cross-section a radiation attenuator, or radiation absorbing system, according to the present invention. The radiation attenuator comprises an enclosure 410 and end faces 411, 412 made of a material, e.g. $CaF_2$, substantially transparent to the radiation of said projection beam; the elements 410, 411 and 412 define a chamber 418. The end faces may be optical elements provided for other purposes in the illumination or projection systems of the lithographic projection apparatus. A radiation absorbing gas, e.g. $O_2$ when the projection beam has a wavelength of 157 nm, is supplied to the chamber 418 from supply 413 via first control valve 414. Egress of gas from the chamber is controlled by a second control valve 415 and optional vacuum pump 416.

The amount of absorbent gas in the chamber 418 is controlled to ensure that the projection beam PB is attenuated to a desired extent as it passes through the chamber 418. The chamber 418 may be supplied with only absorbent gas or with absorbent gas mixed at an appropriate concentration with a transparent gas, e.g. $N_2$.

A sensor 417 may be provided in the chamber 418 to measure the (partial) pressure of the absorbent gas for feedback control. The gas supply may also be controlled responsive to the output of the energy sensor ES or another sensor, e.g. downstream of the radiation attenuator, for sensing the intensity of the projection beam.

The gas inlet(s) and outlet(s) are preferably arranged so that the absorbent gas is evenly distributed in the chamber 418 so as to effect uniform attenuation of the projection beam PB. The radiation attenuator may be situated at any convenient position in the optical path of the projection beam from radiation source to substrate and may be used for intensity control of the projection beam. With a suitably high pressure gas supply and vacuum pumps for extraction of the radiation absorbing gas of sufficient capacity, the reaction time of the radiation attenuator can be much faster than a system for mechanically swapping filters into the beam path.

Embodiment 3

In a third embodiment, which may be the same as the second embodiment except as described below, the radiation attenuator is arranged to have a controllably non-uniform concentration of absorbing gas and is used for filtering diffraction orders of radiation diffracted at the mask upon traversing the mask.

Figure 5:
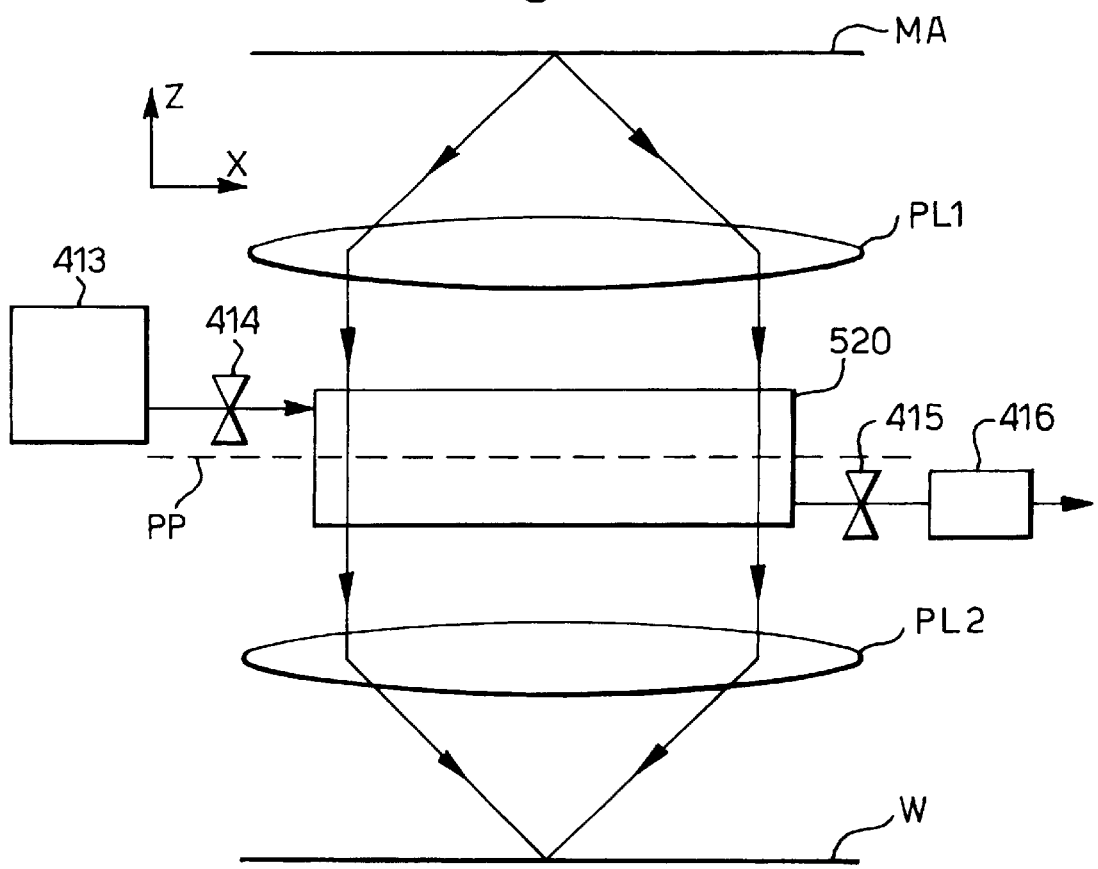
FIG. 5 is a diagram showing a controllable radiation absorber positioned in a pupil plane of a lithographic projection apparatus according to a third embodiment of the invention.

FIG. 5 is a simplified schematic of the optical system of a lithographic projection apparatus from mask MA to substrate W. Within the projection system PL, represented schematically in this figure by two lenses PL1, PL2, is at least one pupil plane PP of the projection system. At the pupil plane PP, the intensity distribution of the patterned projection beam is a Fourier transform of the pattern on the mask. The various diffraction orders of the patterned beam, which are separated in angle at the mask, are separated in space at the pupil plane PP. Accordingly, the diffraction orders can be selectively filtered using a filter of non-uniform transparency. This can be achieved by using radiation attenuator 520 which has a non-uniform concentration of radiation absorbing gas and is situated around or close to the pupil plane. The non-uniform gas may be achieved by dividing the chamber of the radiation attenuator 520 into a plurality of cells placed side-by-side in the pupil plane and having individually controllable gas supplies and evacuation pumps. Alternatively, the radiation attenuator 520 may be provided with gas inlets and outlets arranged to establish a dynamic gradient in the gas concentration.

Figure 6:
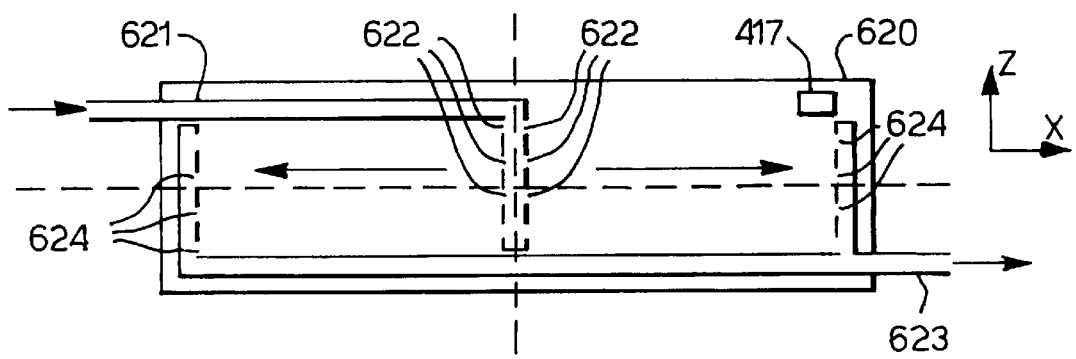
FIG. 6 is a cross-sectional view of the controllable radiation absorber of the third embodiment.

A radiation attenuator 620 of the latter type is illustrated in FIG. 6. In this attenuator, radiation absorbing gas is supplied via a conduit 621 which extends in to the chamber of the attenuator 620 and has one or a plurality of outlets 622 arranged near the optical axis of the projection system PL. Gas is removed from the chamber via conduit 623 which has a plurality of inlets 624 distributed around the periphery of the chamber. By suitable control of the rate of supply of gas and the rate at which it is removed from the chamber, which will depend on the pressure at the outlet(s), a dynamic equilibrium with a radially symmetric gas distribution gradient can be established.

Embodiment 4

In a fourth embodiment, which may be the same as either of the second or third embodiments described above save as described below, the radiation attenuator is used to reduce intensity variations across the exposure slit, especially in a scanning projection apparatus.

The radiation attenuator 730 (radiation absorbing means) of the fourth embodiment is situated in the lithographic projection apparatus at a position where the projection beam profile perpendicular to the optical axis is substantially the same as at substrate level. For example, the radiation attenuator 730 may be positioned at or near the plane of the mask or the substrate, or any plane in the radiation system or the projection system that is substantially conjugate to these planes.

Figure 7:
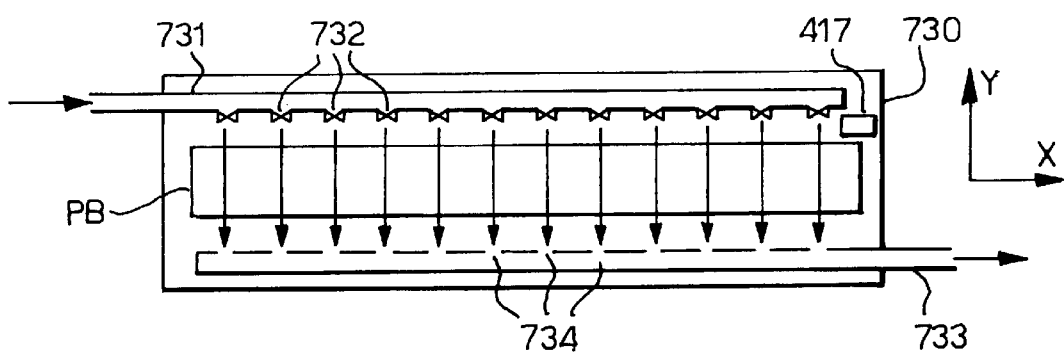
FIG. 7 is a cross-sectional view of a controllable radiation absorber used in a fourth embodiment of the invention.

FIG. 7 is a cross-section perpendicular to the optical axis of the radiation attenuator 730. As can there be seen, radiation absorbing gas is supplied via conduit 731 to a plurality of (micro-)jets 732 arrayed adjacent to the projection beam PB, which has the cross-section of the exposure slit in the plane perpendicular to the optical axis. The array of jets 732 is substantially perpendicular to the scanning direction, e.g. the Y-direction. Opposite the array of jets 732 is a corresponding array of evacuation orifices 734 which are connected to a suitable vacuum pump via conduits 733. Each of jets 732 has an independently controllable valve to control the rate of flow of absorbent gas through it. By appropriate control of these valves and by ensuring that the rate of evacuation of gas from the chamber is suitably high, the concentration of radiation absorbing gas can be varied along the length of the slit so as to compensate for intensity variations in the projection beam perpendicular to the scanning direction and ensure uniform illumination at substrate level. Note that intensity variations parallel to the scanning direction are averaged out by the scanning process itself. Intensity variation can be measured using, for instance, an image sensor, e.g. a Transmission Image Sensor (TIS). An example of a TIS of this type is described in greater detail in U.S. Pat. No. 4,540,277, incorporated herein by reference.

A suitable control system to vary the absorbing gas concentration to effect the desired uniformity can easily be provided.

Whilst specific embodiments of the invention have been described above, it will be appreciated that the invention may be practiced otherwise than as described. The description is not intended to limit the invention.

What is claimed is:

1. A lithographic projection apparatus for imaging a pattern onto a substrate that is at least partially covered by a layer of radiation-sensitive material, the apparatus comprising:
   a radiation system to provide a projection beam of radiation;
   a support structure to support patterning structure, the patterning structure serving to produce a desired pattern in the projection beam;
   a substrate table to hold a substrate;
   a projection system constructed and arranged to project the patterned projection beam onto a target portion of the substrate;
   a gas composition sensor to measure a gas composition in at least one region traversed by the patterned beam of radiation; and
   a radiation control mechanism responsive to said gas composition measured by said gas composition sensor to control the radiation energy delivered by said patterned beam of radiation to said substrate during exposure of said radiation-sensitive material to said patterned beam of radiation.

2. Apparatus according to claim 1 wherein said radiation control mechanism is arranged to adjust at least one of:
   radiation power emitted by a radiation source supplying radiation to said radiation system,
   a number of pulses of radiation delivered by said radiation source during an exposure of a target portion,
   radiation energy of pulses of radiation emitted by said radiation source,
   duration of an exposure of a target portion,
   transmission of a dichroic filter placed in the path of said projection beam,
   speed at which the substrate table is moved during a scanning exposure of a target portion, and
   angular distribution of the radiation energy delivered by said projection beam.

3. Apparatus according to claim 1 wherein said gas composition sensor is arranged to measure the concentration of at least one gas selected from the group comprising oxygen and water vapor.

4. Apparatus according to claim 1 wherein said gas composition sensor comprises a plurality of sensors arranged to measure gas compositions in a corresponding plurality of regions traversed by said projection beam.

5. Apparatus according to claim 1 further comprising an energy sensor for measuring the intensity of said projection beam and wherein said gas composition sensor is arranged to measure gas compositions in at least one region downstream on the optical path of said projection beam relative to said energy sensor.

6. Apparatus according to claim 1 wherein said gas composition sensor is arranged to measure variations of gas composition in directions perpendicular to the optical axis of at least one of the radiation system and the projection system, and wherein said radiation control mechanism is arranged to control the uniformity of intensity of said projection beam perpendicular to said optical axis.

7. Apparatus according to claim 1 wherein said radiation control mechanism comprises a radiation attenuator comprising a gas supply to supply an absorbent gas at a controlled concentration to at least one volume traversed by said projection beam, said absorbent gas serving to absorb radiation of the wavelength of said projection beam.

8. Apparatus according to claim 7 wherein said radiation attenuator comprises an enclosure at least partially surrounding said volume and being substantially transparent to the radiation of said projection beam in a direction parallel to its direction of propagation.

9. Apparatus according to claim 7 further comprising a gas extractor to extract said radiation absorbing gas from said volume.

10. Apparatus according to claim 7 wherein said gas comprises oxygen gas.

11. Apparatus according to claim 7 wherein said gas supply is arranged to supply said radiation absorbing gas mixed at a controlled concentration with a purge gas.

12. Apparatus according to claim 7 wherein said radiation attenuator is arranged to maintain a gas concentration in the path of said projection beam that is controllably non-uniform in a plane perpendicular to the optical axis of at least one of the radiation system and the projection system.

13. Apparatus according to claim 12 wherein said radiation attenuator is arranged to maintain a gas concentration that is substantially symmetric about said optical axis.

14. Apparatus according to claim 12 wherein said volume comprises a pupil plane of said projection system.

15. Apparatus according to claim 12 wherein said radiation attenuator is arranged to maintain a gas concentration that is controllably variable in a direction perpendicular to a scanning direction in which the substrate table is moved during a scanning exposure.

16. Apparatus according to claim 15 wherein said radiation attenuator is located proximate to a plane selected from the group comprising: a plane of said patterning structure, a plane of said substrate, and conjugate planes of said planes of the patterning structure and the substrate.

17. An apparatus according to claim 1, wherein the support structure comprises a mask table for holding a mask.

18. An apparatus according to claim 1, wherein the radiation system comprises a radiation source.

19. A device manufacturing method comprising:
   providing a substrate that is at least partially covered by a layer of radiation sensitive material;
   projecting a patterned beam of radiation onto a target portion of the layer of radiation-sensitive material;
   measuring a composition of gases in at least one region traversed by said patterned beam of radiation;
   controlling at least one of an intensity of said projection beam and a duration of exposure of said radiation-sensitive material to said patterned beam of radiation in response to said measured gas composition, such that a desired dose of radiation is delivered to said substrate during an exposure; and
   supplying an absorbent gas at a controlled concentration to a volume traversed by said projection beam to effect a desired attenuation of said projection beam, said absorbent gas absorbing radiation of the wavelength of the projection beam.

20. A device manufactured according to the method of claim 19.

21. Apparatus according to claim 1,
   wherein said radiation control mechanism is arranged to adjust at least one of:

radiation power emitted by a radiation source supplying radiation to said radiation system, a number of pulses of radiation delivered by said radiation source during an exposure of a target portion, radiation energy of pulses of radiation emitted by said radiation source, transmission of a dichroic filter placed in the path of said projection beam, speed at which the substrate table is moved during a scanning exposure of a target portion, and angular distribution of the radiation energy delivered by said projection beam.

22. Apparatus according to claim 1, wherein said gas composition sensor is arranged to measure the concentration of at least one gas selected from the group comprising air, hydrocarbons, oxygen and water vapor.

23. Apparatus according to claim 1, wherein said gas composition sensor comprises a plurality of sensors arranged to measure gas compositions in a plurality of regions traversed by said projection beam.

* * * * *